United States Patent
Chae

(10) Patent No.: US 10,496,476 B2
(45) Date of Patent: Dec. 3, 2019

(54) MEMORY SYSTEM AND OPERATING METHOD THEREOF

(71) Applicant: SK hynix Inc., Gyeonggi-do (KR)

(72) Inventor: Chol-Su Chae, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 85 days.

(21) Appl. No.: 15/809,048

(22) Filed: Nov. 10, 2017

(65) Prior Publication Data

US 2018/0210789 A1 Jul. 26, 2018

(30) Foreign Application Priority Data

Jan. 23, 2017 (KR) .................. 10-2017-0010430

(51) Int. Cl.
*H03M 13/00* (2006.01)
*G06F 11/10* (2006.01)
*H03M 13/29* (2006.01)
*H03M 13/15* (2006.01)
*H03M 13/45* (2006.01)

(52) U.S. Cl.
CPC ..... *G06F 11/1076* (2013.01); *H03M 13/2909* (2013.01); *H03M 13/2927* (2013.01); *H03M 13/2963* (2013.01); *H03M 13/152* (2013.01); *H03M 13/453* (2013.01)

(58) Field of Classification Search
CPC ........... G06F 11/1076; H03M 13/2909; H03M 13/2927; H03M 13/2963
See application file for complete search history.

(56) References Cited

U.S. PATENT DOCUMENTS

| | | | | |
|---|---|---|---|---|
| 7,549,104 | B2* | 6/2009 | Kim | G11B 20/1866 714/755 |
| 8,347,194 | B2* | 1/2013 | No | H03M 13/1108 714/784 |
| 8,429,498 | B1 | 4/2013 | Anholt et al. | |
| 8,775,897 | B2* | 7/2014 | Wang | H03M 13/47 714/752 |
| 9,116,700 | B2* | 8/2015 | Chinnakkonda Vidyapoornachary | G06F 1/3275 |
| 9,214,962 | B2* | 12/2015 | Murakami | H03M 13/1154 |
| 9,268,635 | B2* | 2/2016 | Sharon | H03M 13/1108 |
| 9,811,418 | B2* | 11/2017 | Sharon | G06F 11/1076 |
| 9,847,141 | B1* | 12/2017 | Sagiv | G11C 29/44 |
| 9,916,432 | B2* | 3/2018 | Bower | G06F 21/32 |
| 10,025,660 | B2* | 7/2018 | Lin | G06F 11/1068 |
| 2016/0179620 | A1 | 6/2016 | Bazarsky et al. | |

FOREIGN PATENT DOCUMENTS

| | | |
|---|---|---|
| KR | 101529880 | 6/2015 |
| KR | 101606498 | 4/2016 |

* cited by examiner

*Primary Examiner* — Esaw T Abraham
(74) *Attorney, Agent, or Firm* — IP & T GROUP LLP

(57) ABSTRACT

A memory system may include: a memory device including a plurality of pages for storing data and a plurality of memory blocks including the pages; and a controller configured to read data, which corresponds to a read command received from a host, from the pages, perform bit flipping with respect to a plurality of constituent codes for the read data, and perform an error correction operation, the bit flipping is updated corresponding to a number of error correction bits in the constituent codes.

16 Claims, 9 Drawing Sheets

FIG. 6

FIG. 7

MEMORY SYSTEM AND OPERATING METHOD THEREOF

CROSS-REFERENCE TO RELATED APPLICATIONS

The present application claims priority of Korean Patent Application No. 10-2017-0010430, filed on Jan. 23, 2017, which is incorporated herein by reference in its entirety.

BACKGROUND

1. Field

Exemplary embodiments relate to a memory system and, more particularly, to a memory system that processes data to and from a memory device, and an operating method thereof.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory or an auxiliary memory of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid-state drives (SSD).

SUMMARY

Various embodiments are directed to a memory system capable of minimizing its complexity and performance deterioration, maximizing the use efficiency of a memory device, and quickly and stably processing data to the memory device, and an operating method thereof.

In an embodiment, a memory system may include: a memory device suitable for storing data and for providing read data to a controller; and the controller suitable for performing a bit flipping operation to one or more flip bits in respective constituent codes of the read data during each loop of a repetitive error correction operation to the constituent codes, the controller may perform the bit flipping operation by selecting the flip bits for the respective constituent codes, and the controller may variably change a number of the flip bits for the respective constituent codes at each loop of the repetitive error correction operation.

The controller may perform the repetitive error correction operation according to a BCH (Bose, Chaudhuri, Hocquenghem) decoding scheme.

The constituent codes may include product codes capable of multi-bit error correction.

The constituent codes may include turbo product codes.

The constituent codes may include a least reliable constituent code and the other constituent codes, the controller may hold the number of flip bits of each of the other constituent codes to a value thereof at a current loop of the repetitive error correction operation, and the controller may perform the bit flipping operation to the held number of flip bits in each of the other constituent codes during a subsequent loop of the repetitive error correction operation.

The controller may perform the bit flipping operation to an increasing number of flip bits in the least reliable constituent code during the subsequent loop of the repetitive error correction operation.

The constituent codes may include a least reliable constituent code and the other constituent codes, the controller may change the number of flip bits of each of the other constituent codes by a number of error-corrected bits in the least reliable constituent code at a current loop of the repetitive error correction operation, and the controller may perform the bit flipping operation to the changed number of flip bits in each of the other constituent codes during a subsequent loop of the repetitive error correction operation.

The controller may perform the bit flipping operation to an increasing number of flip bits in the least reliable constituent code during the subsequent loop of the repetitive error correction operation.

The constituent codes may include a least reliable constituent code and the other constituent codes, the controller may gradually and sequentially increase a number of the flip bits in the least reliable constituent code at each loop the repetitive error correction operation, the controller may increase the number of the flip bits to a maximum number of flip bits, and the controller may perform the repetitive error correction operation to a maximum loop count until the repetitive error correction operation is successful to the constituent codes.

In an embodiment, an operating method of a memory system, the operating may include: performing a bit flipping operation to one or more flip bits in respective constituent codes for a read data; performing one or more loops of a repetitive error correction operation to the constituent codes. The bit flipping operation may be performed by selecting the flip bits for the respective constituent codes, and the performing of the bit flipping operation may include variably changing a number of the flip bits for the respective constituent codes at each loop of the repetitive error correction operation.

The repetitive error correction operation may be performed according to BCH (Bose, Chaudhuri, Hocquenghem) decoding scheme.

The constituent codes may include product codes capable of multi-bit error-correction.

The constituent codes may include turbo product codes.

The constituent codes may include a least reliable constituent code and the other constituent codes, the performing of the bit flipping operation may include holding the number of flip bits of each of the other constituent codes to a value thereof at a current loop of the repetitive error correction operation, and the bit flipping operation may be performed to the held number of flip bits in each of the other constituent codes during a subsequent loop of the repetitive error correction operation.

The bit flipping operation may be performed to increasing number of flip bits in the least reliable constituent code during the subsequent loop of the repetitive error correction operation.

The constituent codes may include a least reliable constituent code and the other constituent codes, the performing of the bit flipping operation may include changing the number of flip bits of each of the other constituent codes by a number of error-corrected bits in the least reliable constituent code at a current loop of the repetitive error correction operation, and the bit flipping operation may be performed to the changed number of flip bits in each of the other constituent codes during a subsequent loop of the repetitive error correction operation.

The bit flipping operation may be performed to increasing number of flip bits in the least reliable constituent code during the subsequent loop of the repetitive error correction operation.

The constituent codes may include a least reliable constituent code and the other constituent codes, the variably changing of the number of the flip bits may include gradually and sequentially increasing a number of the flip bits in the least reliable constituent code at each loop the repetitive error correction operation, the number of the flip bits may be increased to a maximum number of flip bits, and the repetitive error correction operation may be performed to a maximum loop count until the repetitive error correction operation is successful to the constituent codes.

BRIEF DESCRIPTION OF THE DRAWINGS

These and other features and advantages of the present invention will become apparent to those skilled in the art to which the present invention pertains from the following detailed description in reference to the accompanying drawings, wherein:

FIG. 5 to FIG. 7 are diagrams schematically illustrating an error correction operation to read data during a read operation, in accordance with an embodiment of the present invention;

DETAILED DESCRIPTION

Figure 1:
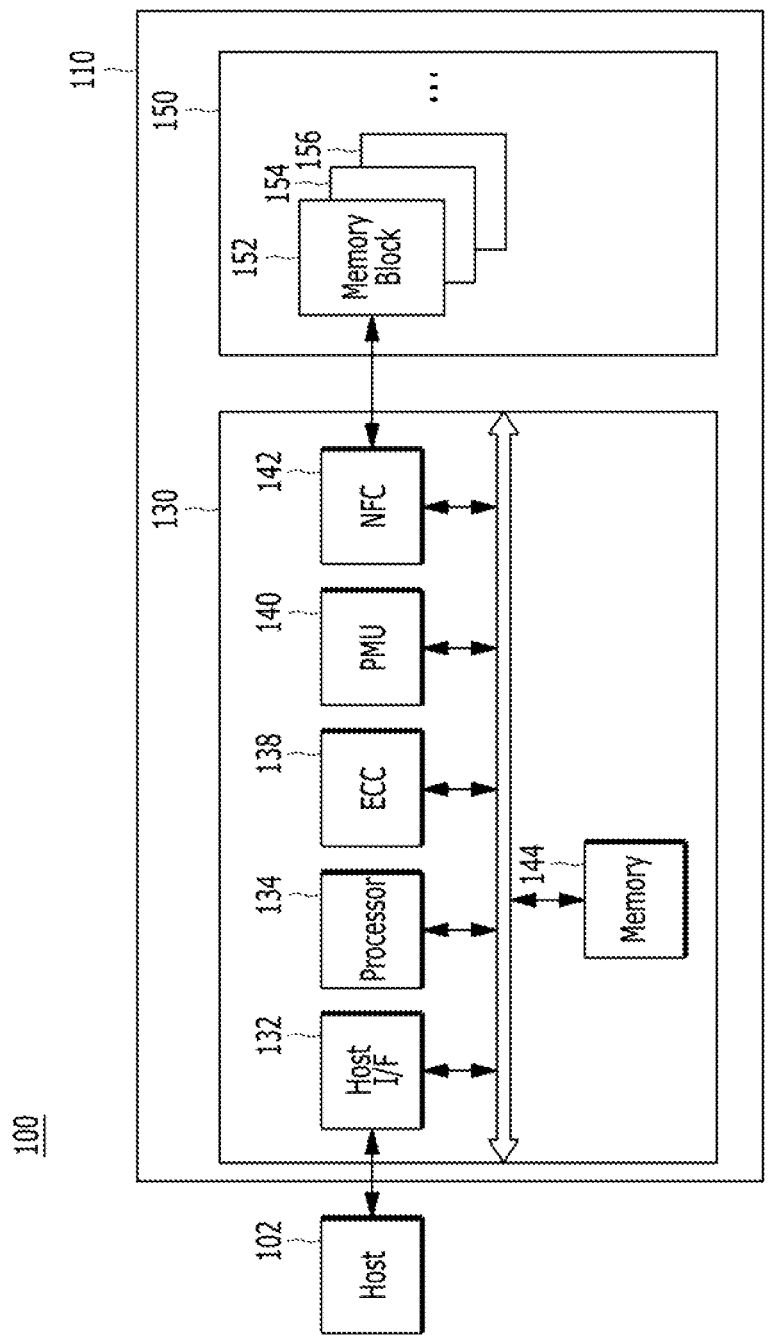
FIG. 1 is a block diagram illustrating a data processing system including a memory system, in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 100, in accordance with an embodiment of the present invention.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limited examples of the memory system 110 may include solid state drive (SSD), multi-media card (MMC), secure digital (SD) card, universal storage bus (USB) device, universal flash storage (UFS) device, compact flash (CF) card, smart media card (SMC), personal computer memory card international association (PCMCIA) card and memory stick. The MMC may include an embedded MMC (eMMC), reduced size MMC (RS-MMC) and micro-MMC, and the SD card may include a mini-SD card and micro-SD card.

The memory system 110 may be embodied by various types of storage devices. Non-limited examples of storage devices included in the memory system 110 may include volatile memory devices such as DRAM dynamic random access memory (DRAM) and static RAM (SRAM) and nonvolatile memory devices such as read only memory (ROM), mask ROM (MROM), programmable ROM (PROM), erasable programmable ROM (EPROM), electrically erasable programmable ROM (EEPROM), ferroelectric RAM (FRAM), phase-change RAM (PRAM), magnetoresistive RAM (MRAM), resistive RAM (RRAM) and flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. The controller 130 may control read, write, program and erase operations of the memory device 150.

The controller 130 may include a host interface (I/F) unit 132, a processor 134, an error correction code (ECC) unit 138, a Power Management Unit (PMU) 140, a memory device controller such as a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through any suitable method including a coded modulation such as Low-Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The memory device controller 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory device controller 142 may be an NFC and may generate a control signal for the memory device 150 and process data to be provided to the memory device 150 under the control of the processor 134. The memory device controller 142 may work as an interface (e.g., a NAND flash interface) for processing a command and data between the controller 130 and the memory device 150. Specifically, the memory device controller 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random-access memory (SRAM) or dynamic random-access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
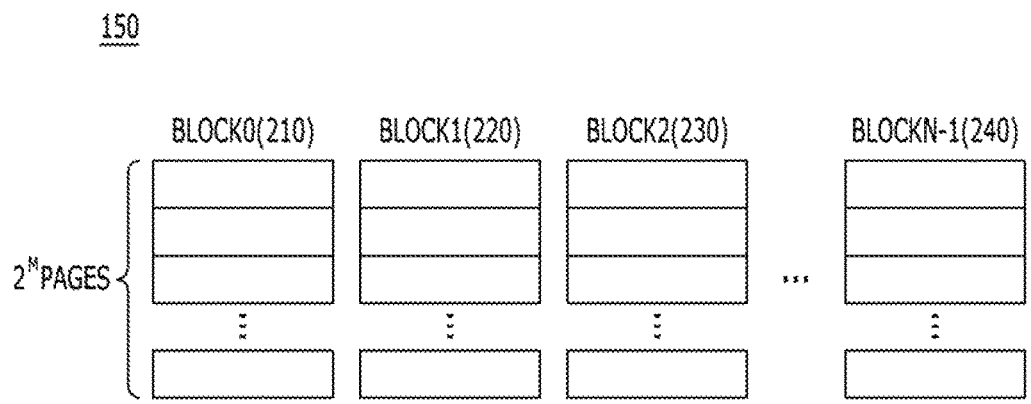
FIG. 2 is a schematic diagram illustrating an exemplary configuration of a memory device employed in the memory system of FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, or a multi-level cell (MLC) such as an MLC storing 2-bit data, a triple level cell (TLC) storing 3-bit data, a quadruple level cell (QLC) storing 4-bit level cell, a multiple level cell storing 5-or-more-bit data, and so forth.

Figure 3:
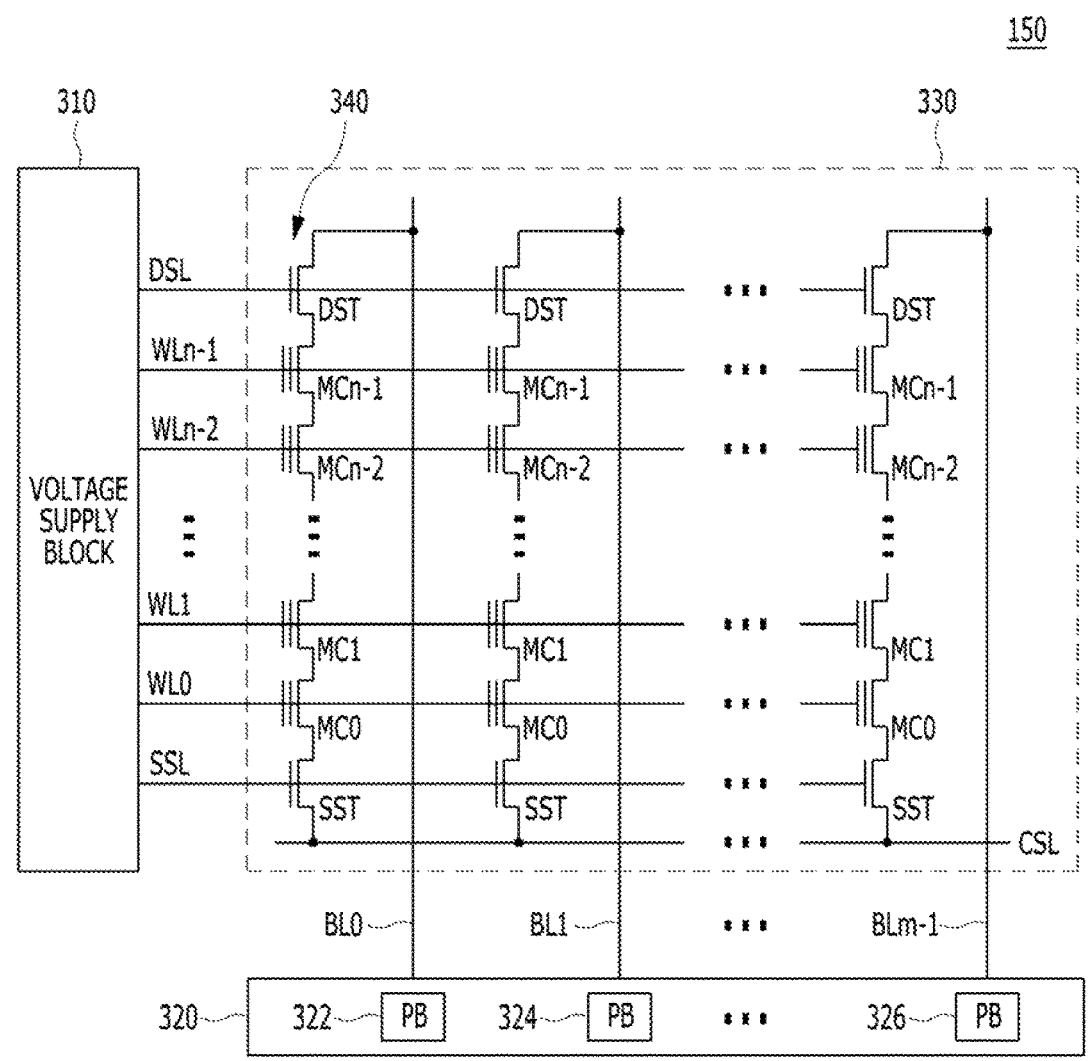
FIG. 3 is a circuit diagram illustrating an exemplary configuration of a memory cell array of a memory block in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
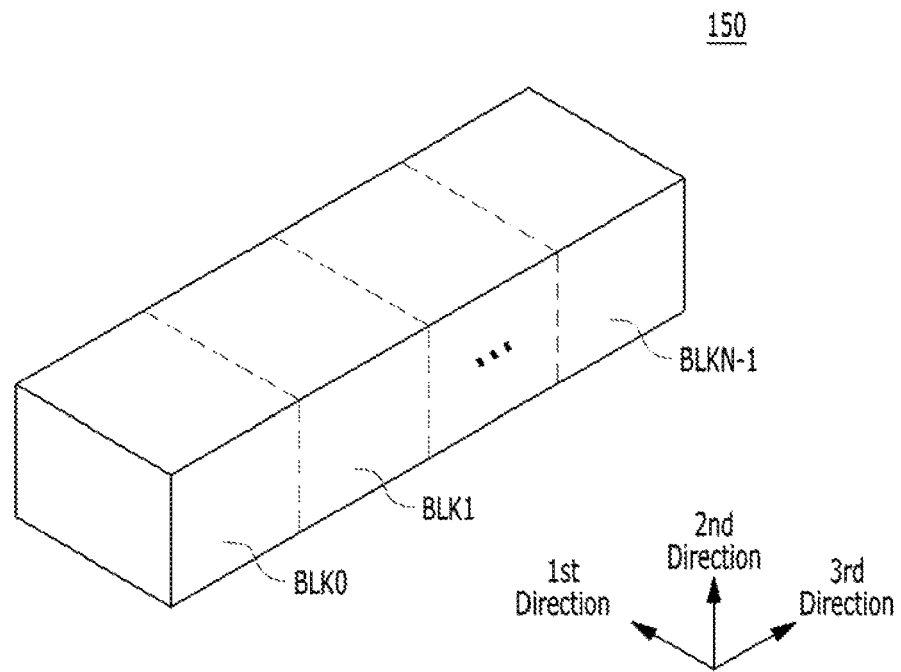
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. In an embodiment, the memory device 150 has a 3D structure, and may include a plurality of memory blocks BLK0 to BLKN−1, each of the memory blocks having a 3D structure (or vertical structure).

Figure 5:
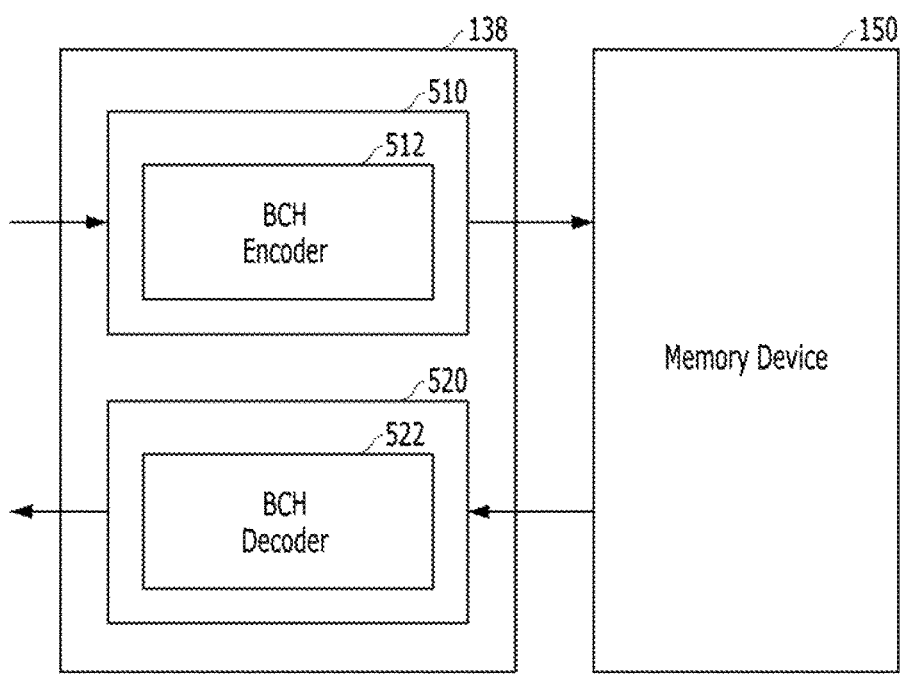
Figures 6, 7:
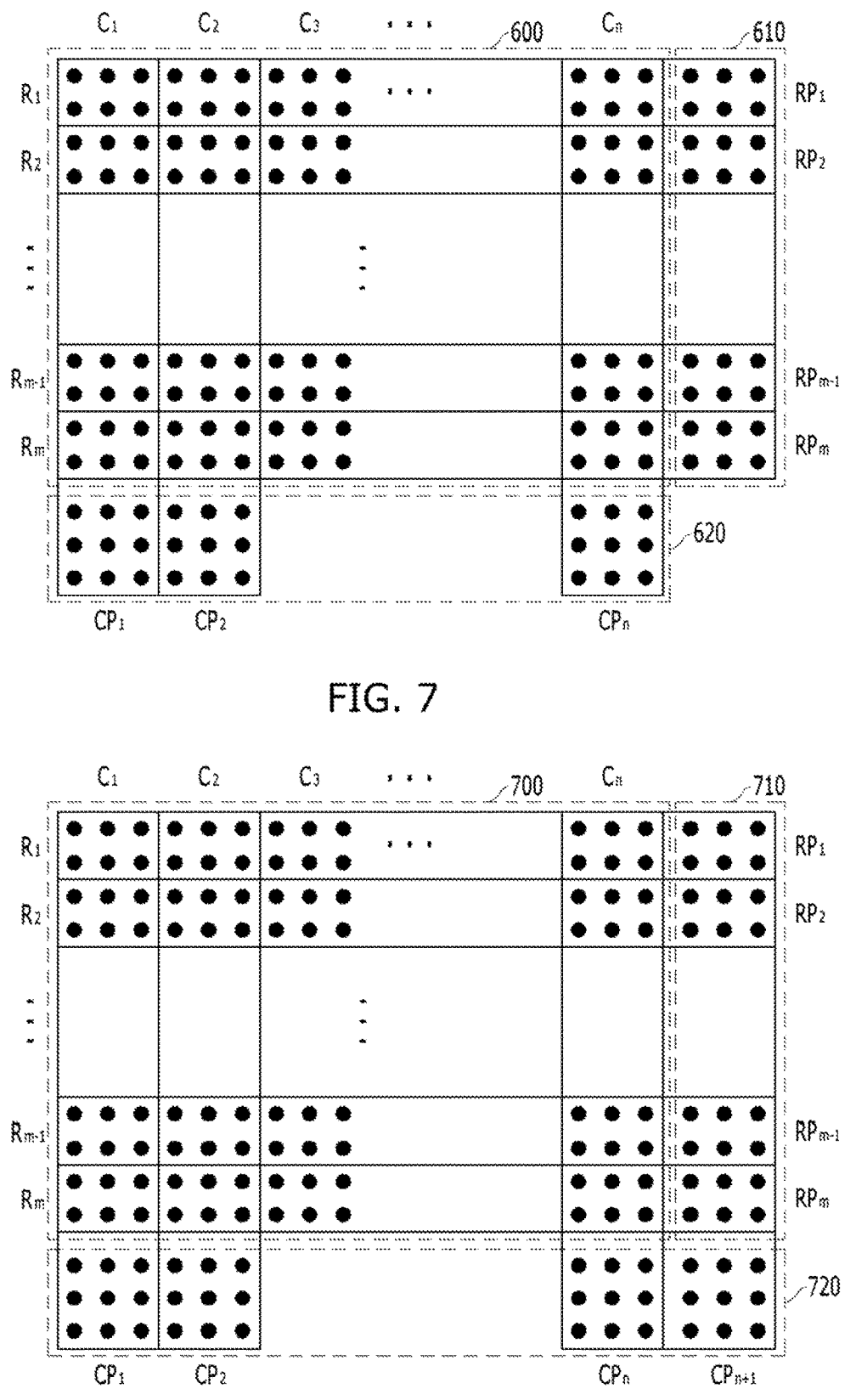

FIG. 5 to FIG. 7 are diagrams for schematically illustrating an error correction operation to read data during a read operation in accordance with an embodiment of the present invention.

Referring to FIG. 5, the ECC unit 138 of the controller 130 includes an ECC encoder 510 that performs ECC encoding operation to write data to be programmed to the memory device 150, and an ECC decoder 520 that performs ECC decoding operation to read data read from the memory device 150.

The ECC encoder 510 includes a BCH encoder 512 that performs BCH code encoding operation, and the ECC decoder 520 includes a BCH decoder 522 that performs BCH code decoding operation. In the illustrated embodiment of FIG. 5, for the purpose of convenience, an example, in which the ECC encoder 510 and the ECC decoder 520 respectively include the BCH encoder 512 and the BCH decoder 522, is described; however, it is noted that the ECC encoder 510 and the ECC decoder may also include different types of encoders and decoders, for example, encoders and decoders using coded modulation of a LDPC code, a turbo code, a Reed-Solomon code, a convolution code, an RSC, a TCM, a BCM and the like. In the memory system, in accordance with the illustrated embodiment, the ECC decoder 520 included in the ECC unit 138 may perform the BCH decoding for data read from the memory device 150 through chase decoding in product codes enabling multi-bit correction such as BCH codes, in other words, TCPs, thereby performing error-correction decoding for the data read from the memory device 150.

Referring to FIGS. 6 and 7, the ECC decoder 520 may arrange the data read from the memory device 150 in a matrix format, and particularly, in a matrix of the parallel concatenated turbo product code (TPC) structure as illustrated in FIG. 6, or in a matrix of the serial concatenated TPC structure as illustrated in FIG. 7. The TPC may be capable of correcting multi-bit error. The ECC decoder 520 performs the BCH decoding operation through chase decoding operation to the matrix of TPCs, particularly, constituent BCH codes included in the parallel concatenated TPC structure of FIG. 6 or the serial concatenated TPC structure of FIG. 7.

The parallel concatenated TPC structure of FIG. 6 includes M×N data bit blocks 600 including M row data bit blocks $R_1$ to $R_m$ and N column data bit blocks $C_1$ to $C_n$, M row parity blocks $RP_1$ to $RP_m$ for the M row data bit blocks $R_1$ to $R_m$, and N column parity blocks $CP_1$ to $CP_n$ for the N column data bit blocks $C_1$ to $C_n$. Each of the M×N data bit blocks 600 may include a single bit or a plurality of bits. It is assumed that each of the M×N data bit blocks 600 includes a plurality of bits.

The ECC decoder 520 may perform error correction operation to the respective M×N data bit blocks 600 in units of codewords by using the M row parity blocks $RP_1$ to $RP_m$ and the N column parity blocks $CP_1$ to $CP_n$. Particularly, by using the M row parity blocks $RP_1$ to $RP_m$ and the N column parity blocks $CP_1$ to $CP_n$ in the M×N data bit blocks 600, the ECC decoder 520 may sequentially perform BCH decoding operation to the constituent BCH codes of the M row data bit blocks $R_1$ to $R_m$ and then sequentially perform the BCH decoding operation to the constituent BCH codes of the N column data bit blocks $C_1$ to $C_n$, or vice versa. In addition, the ECC decoder 520 may alternately perform the BCH decoding operation to the constituent BCH codes of the M row data bit blocks $R_1$ to $R_m$ and the constituent BCH codes of the N column data bit blocks $C_1$ to $C_n$.

In addition, the serial concatenated TPC structure of FIG. 7 includes M×N data bit blocks 700 including M row data bit blocks $R_1$ to $R_m$ and N column data bit blocks $C_1$ to $C_n$, M row parity blocks $RP_1$ to $RP_m$ for the M row data bit blocks $R_1$ to $R_m$, and N+1 column parity blocks $CP_1$ to $CP_{n+1}$ for the N column data bit blocks $C_1$ to $C_n$. The N+1 column parity blocks $CP_1$ to $CP_{n+1}$ in the serial concatenated TPC structure include one column parity block $CP_{n+1}$ overlapping the M row data bit blocks $R_1$ to $R_m$. Each of the M×N data bit blocks 700 may include a single bit or a plurality of bits. It is assumed that each of the M×N data bit blocks 700 includes a plurality of bits.

The ECC decoder 520 may perform error correction operation to the respective M×N data bit blocks 700 in units of codewords by using the M row parity blocks $RP_1$ to $RP_m$ and the N+1 column parity blocks $CP_1$ to $CP_{n+1}$. Particularly, by using the M row parity blocks $RP_1$ to $RP_m$ and the N+1 column parity blocks $CP_1$ to $CP_{n+1}$ in the M×N data bit blocks 700, the ECC decoder 520 may sequentially perform the BCH decoding operation to the constituent BCH codes of the M row data bit blocks $R_1$ to $R_m$ and then sequentially perform the BCH decoding operation to the constituent BCH codes of the N column data bit blocks $C_1$ to $C_n$, or vice versa. In addition, the ECC decoder 520 may alternately perform the BCH decoding operation to the constituent BCH codes of the M row data bit blocks $R_1$ to $R_m$ and the constituent BCH codes of the N column data bit blocks $C_1$ to $C_n$.

For each loop of the BCH decoding operation to the M×N data bit blocks 600 or 700 comprising G (=M×N) constituent BCH codes, the ECC decoder 520 selects Least Reliable Bits (LRBs) included in one (hereinafter, referred to as a least reliable constituent BCH code) among the G numbers of constituent BCH codes, selects one or more flip bits from the LRBs, and performs a bit flipping operation to the selected flip bits. Then the ECC decoder 520 may perform the BCH decoding operation to the G numbers of constituent BCH codes. For example, the ECC decoder 520 selects f numbers of LRBs included in a $g^{th}$ constituent BCH code, which is the least reliable constituent BCH code, among the G numbers of constituent BCH codes, selects k_g numbers of flip bits from the f numbers of LRBs of the least reliable constituent BCH code, and then performs the bit flipping operation to the k_g numbers of flip bits of the least reliable constituent BCH code.

The ECC decoder 520 may perform the BCH decoding operation to the G numbers of constituent BCH codes as many loops as a predetermined maximum BCH decoding loop count until the BCH decoding operation is successful to the G numbers of constituent BCH codes. Basically, as a loop count of the BCH decoding operations increases, or as the BCH decoding operation repeats to the G numbers of constituent BCH codes due to a failure thereof, the ECC decoder 520 may sequentially increase a number of flip bits (i.e., the k_g numbers) of the least reliable constituent BCH code for the bit flipping operation to the selected flip bits per each loop of the BCH decoding operation to the G numbers of constituent BCH codes. The ECC decoder 520 may repeat the BCH decoding operation to the G numbers of constituent BCH codes due to an ECC decoding failure until the number of flip bits reaches a predetermined maximum number of flip bits or until the BCH decoding operation is successful to the G numbers of constituent BCH codes. An initial number of flip bits may be one (1).

In accordance with an embodiment of the present invention, in order to minimize decoding latency of the BCH decoding operation to the G numbers of constituent BCH codes, the ECC decoder 520 performs one of a hold bit flipping operation and a shift bit flipping operation to ones other than the least reliable constituent BCH code among the G numbers of constituent BCH codes while performing the bit flipping operation to the least reliable constituent BCH code with increasing number of flip bits during repeated loops of the BCH decoding operation to the G numbers of constituent BCH codes, which will be described later.

It is assumed that each value of the maximum number of flip bits and the maximum BCH decoding loop count is 4. Under this assumption, the ECC decoder 520 may perform the BCH decoding operation to the G numbers of constituent BCH codes 4 loops until the BCH decoding operation is successful to the G numbers of constituent BCH codes. As a loop count of the BCH decoding operations increases, or as the BCH decoding operation repeats to the G numbers of constituent BCH codes due to a failure thereof, the ECC decoder 520 may sequentially increase a number of flip bits of the least reliable constituent BCH code for the bit flipping operation to the selected flip bits one by one per each loop of the BCH decoding operation to the G numbers of constituent BCH codes. The ECC decoder 520 may repeat the BCH decoding operation to the G numbers of constituent BCH codes due to an ECC decoding failure until the number of flip bits reaches 4 or until the BCH decoding operation is successful to the G numbers of constituent BCH codes.

As a loop count of the BCH decoding operations increases, or as the BCH decoding operation repeats to the G numbers of constituent BCH codes due to a failure thereof, the ECC decoder 520 may sequentially increase the number of flip bits of the least reliable constituent BCH code for the bit flipping operation to the selected flip bits one by one per each loop of the BCH decoding operation to the G numbers of constituent BCH codes.

At this time, as for the constituent BCH codes other than the least reliable constituent BCH code among the G numbers of constituent BCH codes, the ECC decoder 520 may perform one of the hold bit flipping operation and the shift bit flipping operation to the respective constituent BCH codes (e.g., a $h^{th}$ constituent BCH code) other than the least reliable constituent BCH code among the G numbers of constituent BCH codes at a subsequent loop of the BCH decoding operation to the G numbers of constituent BCH codes. The hold bit flipping operation may be performed by holding the number of flip bits of the h constituent BCH code to the current value thereof at a current loop of the BCH decoding operation. The shift bit flipping operation may be performed by changing the number of flip bits of the $h^{th}$ constituent BCH code for the subsequent loop by a weighted number, for example, a number of error-corrected bits, which are error-corrected in the least reliable constituent BCH code at a current loop of the BCH decoding operation.

For example, the ECC decoder 520 selects the f numbers of LRBs of the least reliable constituent BCH code among the G numbers of constituent BCH codes, selects 3 numbers of flip bits among the LRBs, and then performs the bit flipping operation to the 3 numbers of selected flip bits for a current loop of the BCH decoding operation to the G numbers of constituent BCH codes. When 2 bits are error-corrected in the least reliable constituent BCH code at the current loop of the BCH decoding operation, which is failed to the G numbers of constituent BCH codes, the ECC decoder 520 may perform the bit flipping operation to the least reliable constituent BCH code with increasing number of flip bits while performing one of the hold bit flipping operation and the shift bit flipping operation to the constituent BCH codes other than the least reliable constituent BCH code among the G numbers of constituent BCH codes for a subsequent loop of the BCH decoding operation to the G numbers of constituent BCH codes.

For example, at the subsequent loop of the BCH decoding operation to the G numbers of constituent BCH codes due to the failed current loop of the BCH decoding operation, the ECC decoder 520 may sequentially increase the number of flip bits of the least reliable constituent BCH code to have a value of 4 for the bit flipping operation to the selected 4 flip bits of the least reliable constituent BCH code while holding the 3 numbers of flip bits of the $h^{th}$ constituent BCH code to the current value for the hold bit flipping operation to the $h^{th}$ constituent BCH code or while changing the 3 numbers of flip bits of the $h^{th}$ constituent BCH code to have a value of 1 by the 2 numbers of error-corrected bits in the least reliable constituent BCH code at the current loop of the BCH decoding operation for the shift bit flipping operation to the $h^{th}$ constituent BCH code.

Figure 8:
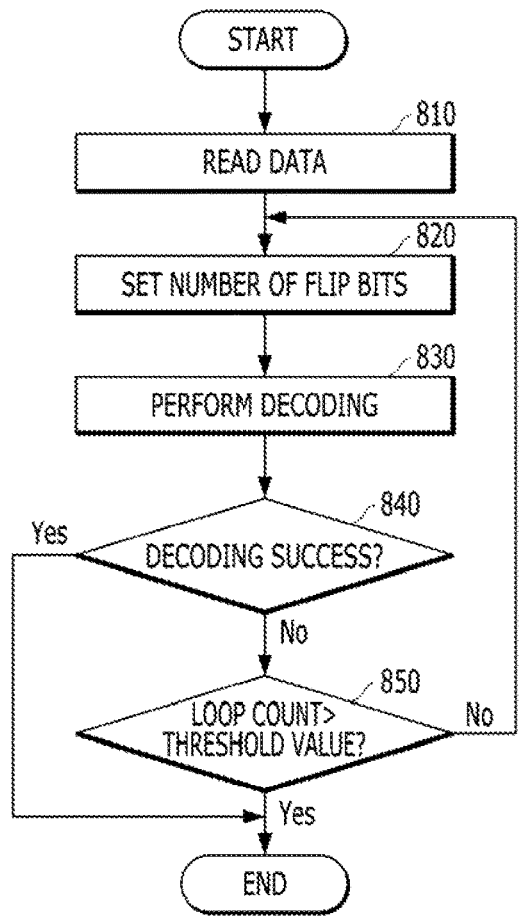
FIG. 8 is a flowchart schematically illustrating an error correction operation during a read operation; in accordance with an embodiment of the present invention.

FIG. 8 is a flowchart schematically illustrating an error correction operation during a read operation, in accordance with an embodiment of the present invention.

Referring to FIG. 8, in step 810, the memory system reads data, which corresponds to the read command received from the host 102, for example, from a memory array of memory dies included in the memory device 150.

In step 820, the memory system sets and updates the number of flip bits in order to perform the BCH decoding operation by performing bit flipping for product codes of the read data, particularly, BCH codes.

In step 830, the memory system performs bit flipping for the BCH codes of the read data according to the number of flip bits, thereby performing the BCH decoding operation.

In step 840, the memory system checks whether the BCH decoding for the read data has succeeded. When the decoding for the read data fails, the memory system checks whether the BCH decoding operation has been performed by the maximum BCH decoding loop count, and repeatedly performs the bit flipping for the BCH codes of the read data by the maximum BCH decoding loop count, thereby performing the BCH decoding operation in step 850. The bit flipping is updated corresponding to bit flipping according to error correction bits, in other words, is set by adjusting the number of flip bits in step 820.

Since the error correction operation of the memory system 110 with respect to the data read from the memory array of the memory dies included in the memory device 150 in the case of performing the read operation corresponding to the read command received from the host 102 has been described in more detail with reference to FIG. 5 to FIG. 7, a detailed description thereof will be omitted.

Hereinafter, with reference to FIG. 9 to FIG. 17, a detailed description will be provided for a data processing system and an electronic appliance, which employ the memory system 110 including the memory device 150 and the controller 130 described in FIG. 1 to FIG. 8 in accordance with various embodiments of the present invention.

FIGS. 9 to 17 are diagrams schematically illustrating application examples of the data processing system of FIG. 1.

Figure 9:
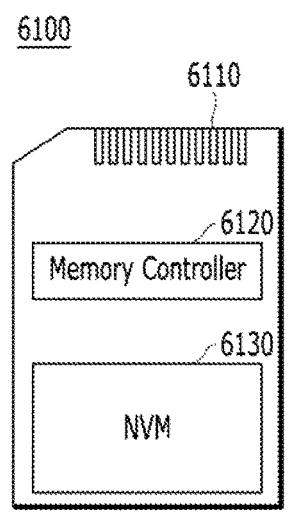
FIGS. 9 to 17 are diagrams schematically illustrating application examples of the data processing system shown in FIG. 1, in accordance with various embodiments of the present invention.

FIG. 9 is a diagram schematically illustrating another example of the data processing system including the memory system in accordance with the present embodiment. FIG. 9 schematically illustrates a memory card system to which the memory system in accordance with an embodiment of the present invention is applied.

Referring to FIG. 9, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 5, and the memory device 6130 may correspond to the memory device 150 of the memory system 110 described with reference to FIGS. 1 and 5.

Thus, the memory controller 6120 may include a RAM, a processing unit, a host interface, a memory interface and an error correction unit. The memory controller 130 may further include the elements shown in FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 10:
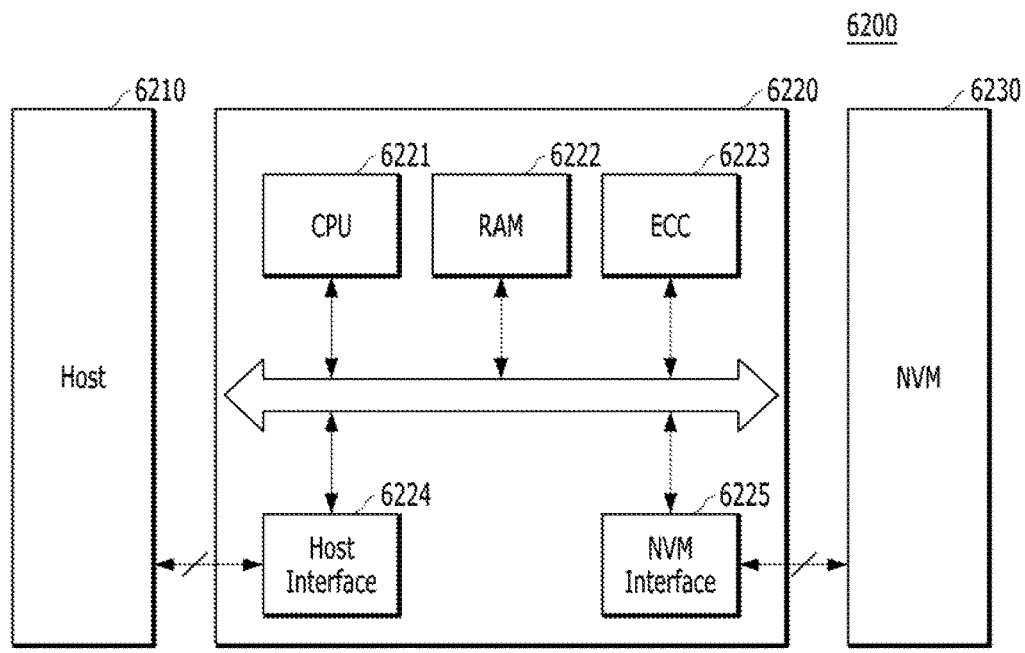

FIG. 10 is a diagram schematically illustrating another example of the data processing system including the memory system in accordance with the present embodiment.

Referring to FIG. 10, the data processing system 6200 may include a memory device 6230 having one or more nonvolatile memories and a memory controller 6220 for controlling the memory device 6230. The data processing system 6200 illustrated in FIG. 10 may serve as a storage medium such as a memory card (CF, SD, micro-SD or the like) or USB device, as described with reference to FIG. 1. The memory device 6230 may correspond to the memory device 150 in the memory system 110 of FIGS. 1 and 8, and the memory controller 6220 may correspond to the controller 130 in the memory system 110 of FIGS. 1 and 8.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction operation on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WIFI or Long-Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 11:
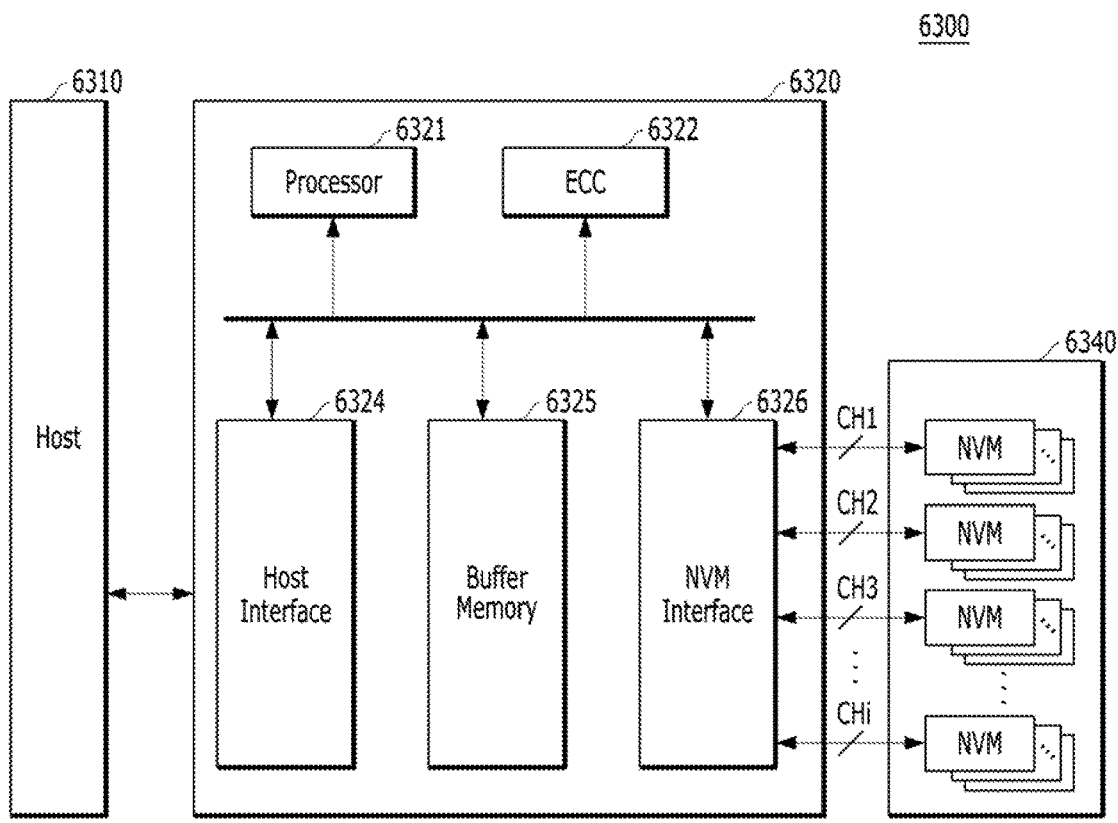

FIG. 11 is a diagram schematically illustrating another example of the data processing system including the memory system in accordance with the present embodiment. FIG. 11 schematically illustrates an SSD to which the memory system is applied, in accordance with the present embodiment.

Referring to FIG. 11, the SSD 6300 may include a controller 6320 and a memory device 6340 including a plurality of nonvolatile memories. The controller 6320 may correspond to the controller 130 in the memory system 110 of FIGS. 1 to 8, and the memory device 6340 may correspond to the memory device 150 in the memory system of FIGS. 1 to 8.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 10 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 to 8 is applied may be provided to embody a data processing system, for example, Redundant Array of Independent Disks (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
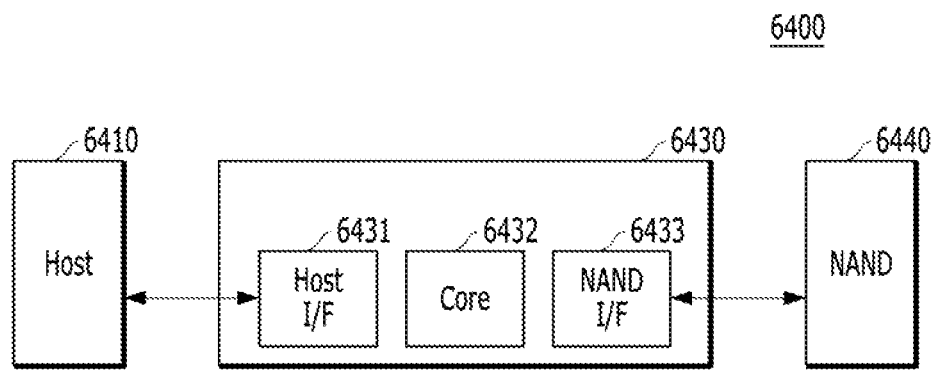

FIG. 12 is a diagram schematically illustrating another example of the data processing system including the memory system in accordance with the present embodiment. FIG. 12 schematically illustrates an embedded Multi-Media Card (eMMC) to which the memory system in accordance with the present embodiment is applied.

Referring to FIG. 12, the eMMC 6400 may include a controller 6430 and a memory device 6440 embodied by one or more NAND flash memories. The controller 6430 may correspond to the controller 130 in the memory system 110 of FIGS. 1 to 8, and the memory device 6440 may correspond to the memory device 150 in the memory system 110 of FIGS. 1 to 8.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I/UHS-II interface.

FIGS. 13 to 16 are diagrams schematically illustrating other examples of the data processing system including the memory system in accordance with the present embodiment.

FIGS. 13 to 16 schematically illustrate Universal Flash Storage (UFS) systems to which the memory system is applied, in accordance with the present embodiment.

Referring to FIGS. 13 to 16, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 5. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card 6100 described with reference to FIG. 9.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI Unified Protocol (UniPro) in Mobile Industry Processor Interface (MIPI). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 13:
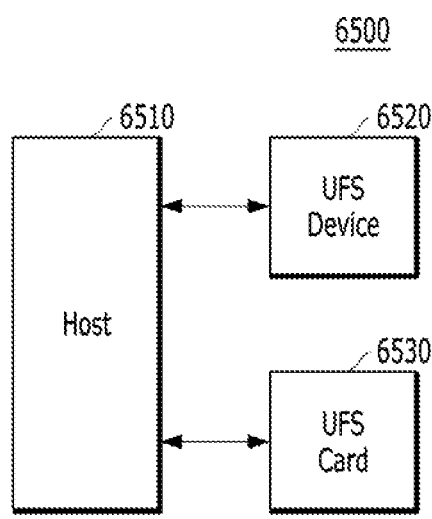

In the UFS system 6500 illustrated in FIG. 13, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 14:
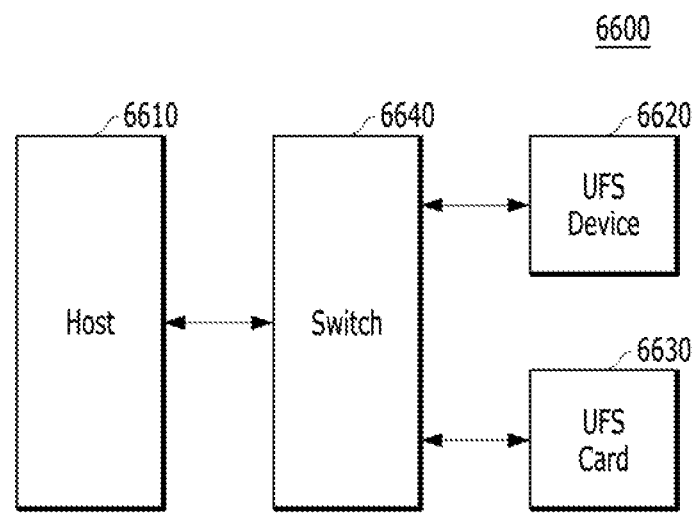

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 15:
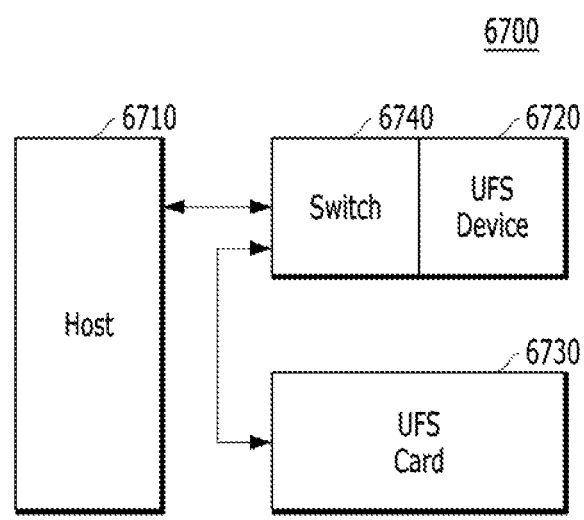

In the UFS system 6700 illustrated in FIG. 15, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
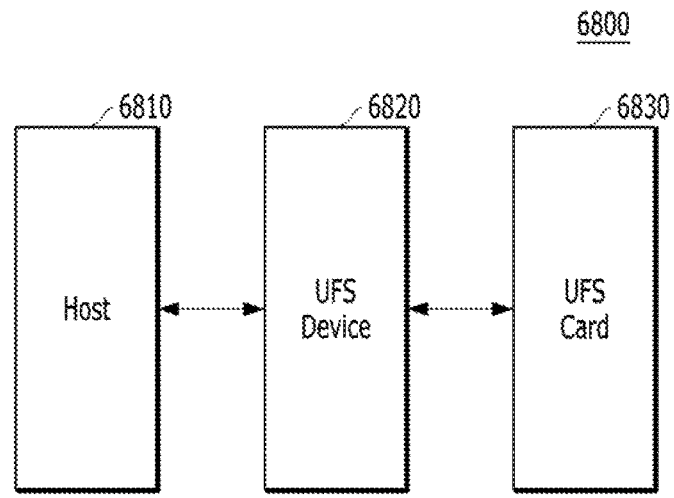

In the UFS system 6800 illustrated in FIG. 16, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
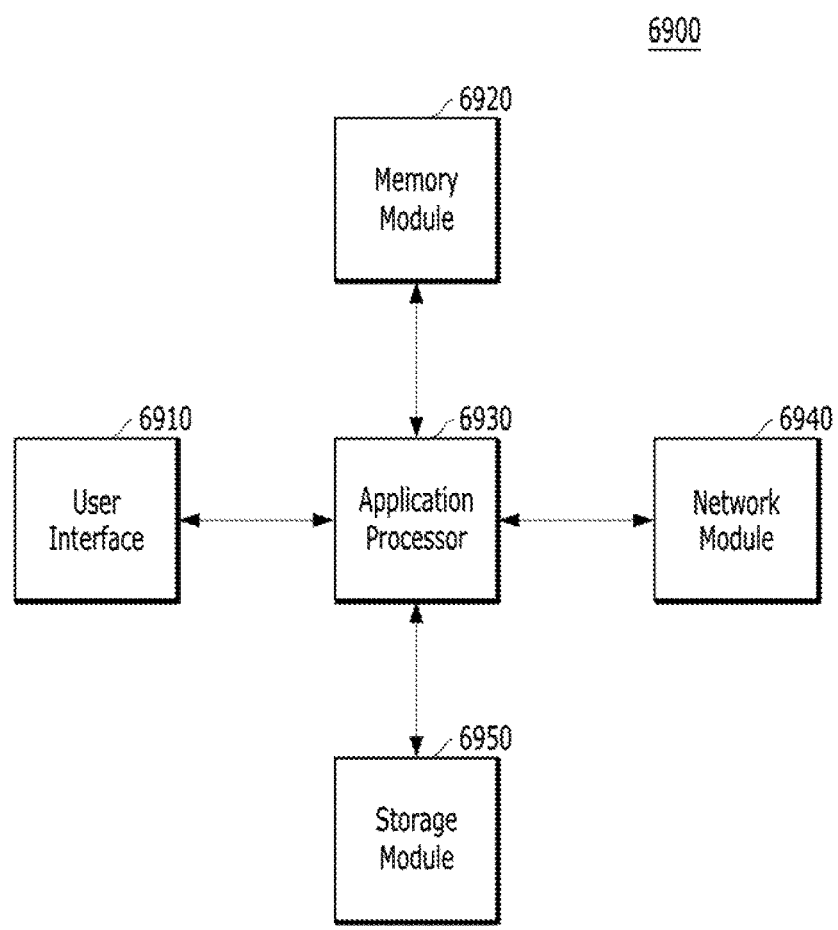

FIG. 17 is a diagram schematically illustrating another example of the data processing system including the memory system, in accordance with an embodiment. FIG. 17 is a diagram schematically illustrating a user system to which the memory system is applied, in accordance with the present embodiment.

Referring to FIG. 17, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on Package on Package (POP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 to 8. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 to 8 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In the memory system and the operating method thereof in accordance with embodiments, it is possible to minimize complexity and performance deterioration of the memory system, maximize the use efficiency of a memory device, and quickly and stably process data to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory device suitable for storing data and for providing read data to a controller; and
the controller suitable for performing a bit flipping operation to one or more flip bits in respective constituent codes of the read data during each loop of a repetitive error correction operation to the constituent codes,
wherein the controller performs the bit flipping operation by selecting the flip bits for the respective constituent codes,
wherein the controller variably changes a number of the flip bits for the respective constituent codes at each loop of the repetitive error correction operation,
wherein the constituent codes includes a least reliable constituent code and the other constituent codes,
wherein the controller gradually and sequentially increases a number of the flip bits in the least reliable constituent code at each loop the repetitive error correction operation,
wherein the controller increases the number of the flip bits to a maximum number of flip bits, and
wherein the controller performs the repetitive error correction operation to a maximum loop count until the repetitive error correction operation is successful to the constituent codes.

2. The memory system of claim 1, wherein the controller performs the repetitive error correction operation according to a BCH (Bose, Chaudhuri, Hocquenghem) decoding scheme.

3. The memory system of claim 1, wherein the constituent codes include product codes capable of multi-bit error correction.

4. The memory system of claim 1, wherein the constituent codes include turbo product codes.

5. The memory system of claim 1,
wherein the controller holds the number of flip bits of each of the other constituent codes to a value thereof at a current loop of the repetitive error correction operation, and
wherein the controller performs the bit flipping operation to the held number of flip bits in each of the other constituent codes during a subsequent loop of the repetitive error correction operation.

6. The memory system of claim 5, wherein the controller performs the bit flipping operation to an increasing number of flip bits in the least reliable constituent code during the subsequent loop of the repetitive error correction operation.

7. The memory system of claim 1,
wherein the controller changes the number of flip bits of each of the other constituent codes by a number of error-corrected bits in the least reliable constituent code at a current loop of the repetitive error correction operation, and
wherein the controller performs the bit flipping operation to the changed number of flip bits in each of the other constituent codes during a subsequent loop of the repetitive error correction operation.

8. The memory system of claim 7, wherein the controller performs the bit flipping operation to an increasing number of flip bits in the least reliable constituent code during the subsequent loop of the repetitive error correction operation.

9. An operating method of a memory system, the operating method comprising:
performing a bit flipping operation to one or more flip bits in respective constituent codes for a read data;
performing one or more loops of a repetitive error correction operation to the constituent codes,
wherein the bit flipping operation is performed by selecting the flip bits for the respective constituent codes,
wherein the performing of the bit flipping operation includes variably changing a number of the flip bits for the respective constituent codes at each loop of the repetitive error correction operation,
wherein the constituent codes includes a least reliable constituent code and the other constituent codes,
wherein the variably changing of the number of the flip bits includes gradually and sequentially increasing a number of the flip bits in the least reliable constituent code at each loop the repetitive error correction operation,
wherein the number of the flip bits is increased to a maximum number of flip bits, and
wherein the repetitive error correction operation is performed to a maximum loop count until the repetitive error correction operation is successful to the constituent codes.

10. The operating method of claim 9, wherein the repetitive error correction operation is performed according to BCH (Bose, Chaudhuri, Hocquenghem) decoding scheme.

11. The operating method of claim 9, wherein the constituent codes include product codes capable of multi-bit error-correction.

12. The operating method of claim 9, wherein the constituent codes include turbo product codes.

13. The operating method of claim 9,
wherein the performing of the bit flipping operation includes holding the number of flip bits of each of the other constituent codes to a value thereof at a current loop of the repetitive error correction operation, and
wherein the bit flipping operation is performed to the held number of flip bits in each of the other constituent codes during a subsequent loop of the repetitive error correction operation.

14. The operating method of claim 13, wherein the bit flipping operation is performed to increasing number of flip bits in the least reliable constituent code during the subsequent loop of the repetitive error correction operation.

15. The operating method of claim 9,
wherein the performing of the bit flipping operation includes changing the number of flip bits of each of the other constituent codes by a number of error-corrected bits in the least reliable constituent code at a current loop of the repetitive error correction operation, and
wherein the bit flipping operation is performed to the changed number of flip bits in each of the other constituent codes during a subsequent loop of the repetitive error correction operation.

16. The operating method of claim 15, wherein the bit flipping operation is performed to increasing number of flip bits in the least reliable constituent code during the subsequent loop of the repetitive error correction operation.

\* \* \* \* \*